United States Patent [19]

Koscica et al.

[11] Patent Number: 5,321,367

[45] Date of Patent: Jun. 14, 1994

[54] CIRCUIT FOR MEASURING CAPACITANCE AT HIGH DC BIAS VOLTAGE

[75] Inventors: Thomas E. Koscica, Clark; Richard W. Babbitt, Fair Haven, both of N.J.

[73] Assignee: The United States of America as represented by the Secretary of the Army, Washington, D.C.

[21] Appl. No.: 947,600

[22] Filed: Sep. 21, 1992

[51] Int. Cl.$^5$ .................................................. G01R 27/26
[52] U.S. Cl. ..................................... 324/663; 324/678
[58] Field of Search ................... 324/76.66, 658, 663, 324/676, 678, 681; 340/870.37

[56] References Cited

U.S. PATENT DOCUMENTS

| | | | |
|---|---|---|---|
| 4,050,018 | 9/1977 | Goodman | 324/649 X |
| 4,149,231 | 4/1979 | Bukosky et al. | 324/678 X |
| 4,165,483 | 8/1979 | Holdren et al. | 324/661 |
| 4,404,517 | 9/1983 | Machida | 324/678 X |
| 4,806,846 | 2/1989 | Kerber | 324/678 |
| 5,014,011 | 5/1991 | Colvin | 324/663 |

Primary Examiner—Kenneth A. Wieder
Assistant Examiner—Christopher M. Tobin
Attorney, Agent, or Firm—Michael Zelenka; William H. Anderson

[57] ABSTRACT

A circuit for measuring capacitor properties under high DC bias voltage. A capacitor is subject to a high DC bias by a high voltage supply having low AC impedance. A triangle wave voltage is applied to the capacitor at the terminal opposite the high bias voltage. A current is thereby induced due to the voltage difference across the capacitor generated by the triangle wave. The induced current is measured and properties of the capacitor calculated therefrom. The measuring circuitry is isolated from the high DC bias voltage applied to the capacitor. Therefore, the biasing voltage applied to the capacitor is limited only by the breakdown voltage of the capacitor under test.

2 Claims, 2 Drawing Sheets

5,321,367

CIRCUIT FOR MEASURING CAPACITANCE AT HIGH DC BIAS VOLTAGE

STATEMENT OF GOVERNMENT RIGHTS

The invention described herein may be manufactured, used, and licensed by or for governmental purposes without the payment to us of any royalties thereon.

BACKGROUND OF THE INVENTION

1. Field of the Invention

This invention relates generally to the field of measuring properties of a capacitor, and more particularly to a circuit capable of measuring capacitance when the capacitor is biased with a high voltage, limited only to the breakdown voltage of the capacitor.

2. Background of the Invention

There are many different circuits used for measuring capacitance of a capacitor. However, these circuits are usually limited in the biasing voltage that can be applied to the capacitor being tested. This biasing limit is generally the breakdown voltage of the measuring circuit. The breakdown voltage of the measuring circuit is usually much less than the breakdown voltage of the capacitor being measured. Therefore, it is not possible to measure the capacitor near the breakdown voltage of the capacitor. Accordingly, there is a need for a circuit that is capable of measuring a capacitor near the breakdown voltage of the capacitor.

SUMMARY OF THE INVENTION

The present invention provides a circuit capable of measuring the capacitance of a capacitor when a high biasing voltage is applied to the capacitor. The high biasing voltage applied to the capacitor is limited only by the breakdown voltage of the capacitor. A low AC impedance voltage bias supply is used in combination with a pre-charging switch to pre-charge a capacitor under test. When the capacitor is charged, the switch is connected to the measurement side of the circuit. A relatively low voltage AC signal is applied to the capacitor under test at the terminal opposite the low AC impedance voltage bias supply. This results in an AC voltage difference across the capacitor resulting in an AC induced current. This induced current is representative of the capacitance. The induced current from the capacitor is converted into a voltage and further processed to obtain a final output voltage which is proportional to the capacitance value of the capacitor under test.

Accordingly, it is an objective of the present invention to measure capacitance of a capacitor at a high bias voltage limited only to the breakdown voltage of the capacitor being measured.

It is an advantage of the present invention that the biasing voltage applied to the capacitor is independent of the breakdown voltage of the test circuit.

It is a feature of the present invention that the current induced by the capacitor is used to determine capacitance of the capacitor.

These and other objectives, advantages, and features will become readily apparent in view of the following more detailed description.

DETAIL DESCRIPTION OF THE PREFERRED EMBODIMENT

Figure 1:
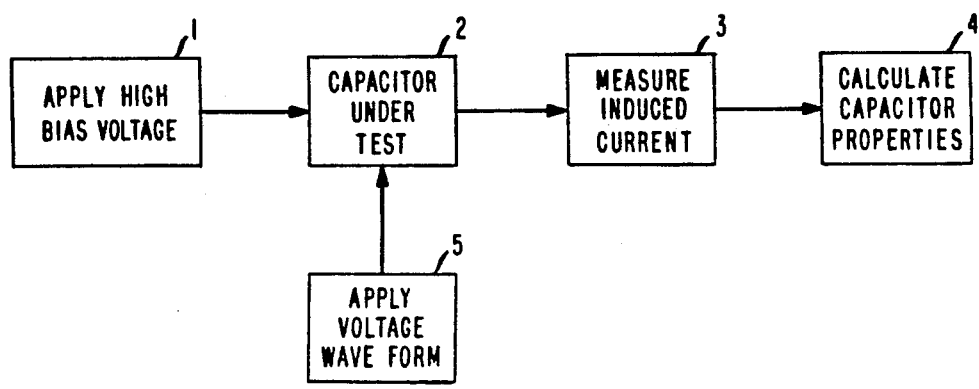
FIG. 1 is a flow chart-type drawing illustrating the present invention.

FIG. 1 represents the basic concept of the present invention in a flow chart-type form. A high bias voltage, represented by box 1, is applied to a capacitor, represented by box 2, under test. A voltage waveform, represented by box 5, is applied to the capacitor, represented by box 2, under test. As a result of the application of a voltage waveform 5 to the capacitor 2 under test, a current is induced. The induced current is measured. The measurement of the induced current is represented by box 3. Box 4 represents the calculation of the capacitor properties from the induced current. As can clearly be appreciated, the measurement of an induced current 3 due to an applied voltage waveform 5 is independent of the bias voltage applied to the capacitor 2 under test. FIG. 1, therefore, represents the basic concept of the present invention.

Figure 2:
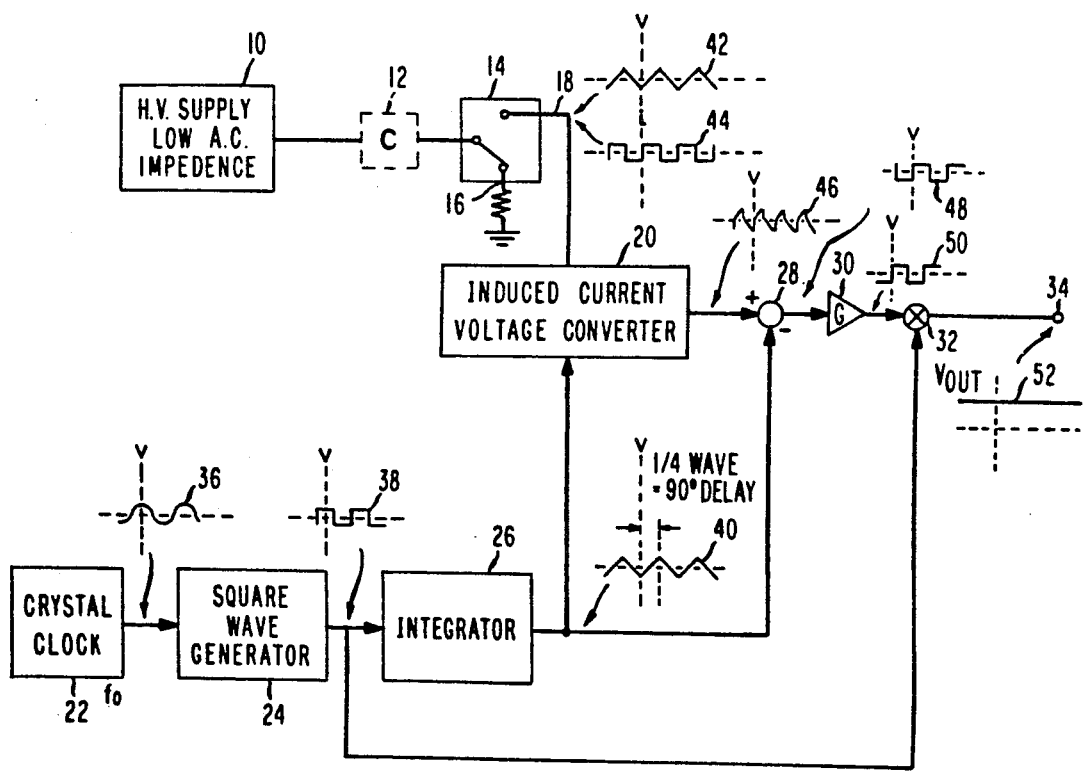
FIG. 2 is a block diagram illustrating the present invention.

FIG. 2 is a block diagram illustrating one form of the present invention. A high voltage DC (direct current) power supply 10 having low AC (alternating current) impedance is applied to a capacitor 12 or device under test. The capacitor 12 is also connected to a switch 14. Switch 14 has a pre-charge side 16 and a measurement side 18. The pre-charge side 16 is grounded through a resistance. The pre-charge side 16, when connected, permits the capacitor to become charged, reaching a steady state. The measurement side 18 of the switch 14 is coupled to an integrator 26 through an induced current-voltage converter 20. A clock 22 generates a frequency $f_0$. This frequency is fed into a square wave generator 24 for producing a square wave. The square wave is then integrated by integrator 26 forming a triangular wave 90 degrees delayed or out of phase with the square wave generated by the square wave generator 24. The integrator 26 is coupled to the measurement side 18 of switch 14 through the induced current-voltage converter means 20. The output of the induced current-voltage converter means 20 is fed into a differential means 28. The output of the differential means is fed into an amplifier 30 having a gain G. The output of the amplifier 30 is fed into a multiplier 32. Multiplier 32 has an additional input from square wave generator 24. Multiplier 32 has an output 34.

The operation of the device can most clearly be illustrated with reference to the waveforms illustrated as 36-52. A high voltage is applied to the capacitor 12 by high voltage power supply 10. When switch 14 is connected to the pre-charge side 16, the capacitor 12 will become charged. Once the capacitor 12 has become fully charged or reached a steady state, a measurement can then be taken. In order to obtain a measurement of the capacitor 12, switch 14 is connected to the measurement side 18. Due to the fully charged state of the capacitor, there is no initial voltage difference across the capacitor 12. Therefore, no current is induced to flow. Integrator 26 forms a triangle wave which is applied unaffected through induced current-voltage converter means 20 to the capacitor 12. The triangle wave as applied to the capacitor 12 is illustrated as waveform 40 and 42. The peak to peak voltage of the triangle wave is much less than the voltage applied to the capacitor 12 by the high voltage power supply 10. The frequency generated by the clock 22 is illustrated by waveform 36, which sets the system frequency $f_0$. The square wave generated by square wave generator 24 is illustrated by waveform 38.

Upon application of the triangle wave from integrator 26, illustrated as waveforms 40 and 42, to capacitor 12 a current will be induced. The induced current is caused by the voltage difference across the capacitor 12 caused by the application of the triangular wave from integrator 26. This induced current will be applied to the measurement side 18. Waveform 44 illustrates the induced current. It should be noted that this induced current is in the form of a square wave. The shape of the waveform of the induced current is the derivative of the applied voltage. The induced current square wave, represented by waveform 44, is then applied to the induced current-voltage converter means 20. The induced current-voltage converter means 20 converts the current into a voltage. The output of the induced current-voltage converter 20 is the sum of the triangle wave input represented by waveform 40, and the induced current, represented by waveform 44, which has been converted into a voltage. These two voltages are summed and represented by waveform 46. In order to obtain the waveform representative of the induced current, it is necessary to subtract the triangular wave, represented by waveform 40. This is accomplished by differential means 28. Differential means 28 subtracts the triangular wave, represented by waveform 40, from the output of the induced current-voltage converter means 20. Waveform 48 now represents, in voltage form, the induced current from the capacitor. The output of the differential means 28 is fed into an amplifier 30 having a gain G. The output of the amplifier 30 is represented by waveform 50. The output of amplifier 30 is fed into a multiplier 32 and multiplied with the output of the square wave generator 24, represented by waveform 38. Multiplier 32 has an output 34 which is represented by wave form 52. The output 34 is proportional to the capacitance of the capacitor 12.

Figure 3:
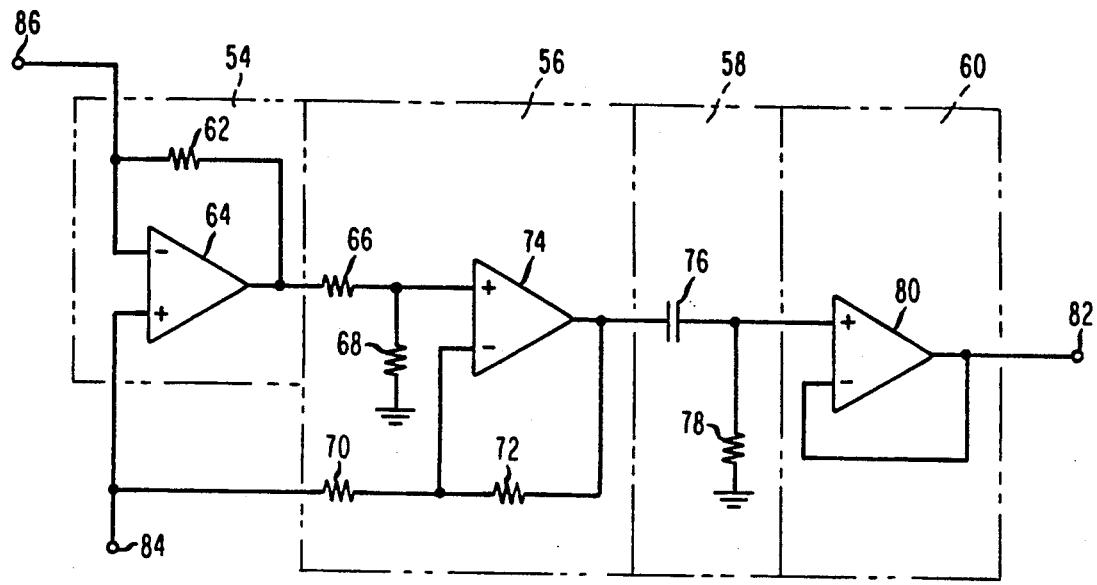
FIG. 3 is a schematic illustrating a portion of a circuit used in the present invention.
Figure 4:
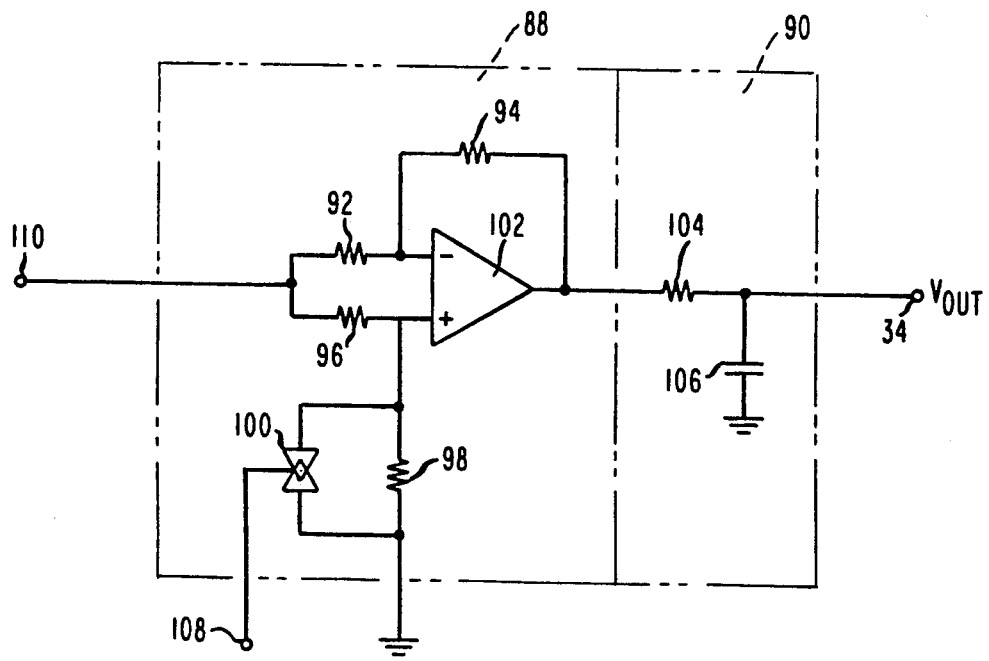
FIG. 4 is a schematic illustrating a portion of a circuit used in the present invention.

FIGS. 3 and 4 illustrate specific circuits used in accordance with the block diagram of FIG. 2. The circuit illustrated in FIG. 3 is broken down into four basic components, each enclosed by dashed lines. Component 54 generally corresponds to the induced current-voltage converter means illustrated in FIG. 2 as 20. Component 54 has a resistor 62 and an operational amplifier 64 contained therein. Component 56 is a conventional differential amplifier circuit corresponding generally to elements 28 and 30 in FIG. 2. Component 56 has therein resistors 66-72 and operational amplifier 74. Resistor 66 is equal to resistor 70 and resistor 68 is equal to resistor 72. Component 58 is a high pass filter. Component 58 is comprised of a capacitor 76 and a resistor 78. Component 60 is a follower boosting the signal, and is comprised of an operational amplifier 80. The circuit illustrated in FIG. 3 has a first input 86 and a second input 84. Input 86 is fed the induced current, represented by waveform 44 illustrated in FIG. 2, generated by the capacitor 12 under test. Input 84 is fed the triangular wave signal, represented by waveform 40 in FIG. 2. The induced current applied to input 86 is converted into a voltage by resistor 62. The output 82 from the circuit illustrated in FIG. 3 is fed into one input of the circuit illustrated in FIG. 4.

The circuit illustrated in FIG. 4 has primarily two components, each enclosed in dashed lines. Component 88 generally corresponds to the multiplier 32 illustrated in FIG. 2. Component 88 is comprised of resistors 92-98, switch 100, and operational amplifier 102. Resistor 92 is equal to resistor 98 and resistor 94 is equal to resistor 96. In addition, the resistance of resistors 92 and 98 is twice that of resistors 94 and 96. Component 90 is a low pass filter, and comprised of a resistor 104 and a capacitor 106. The output 34 of this low pass filter is a voltage representative of the capacitance of the capacitor 12 under test.

The output 82 of the circuit illustrated in FIG. 3 is fed into the input 110 of the circuit illustrated in FIG. 4 which as those skilled in the art will readily recognize as a quadrature demodulation circuit. A square wave, illustrated as waveform 38 in FIG. 2, is applied to square wave input 108. Switch 100 is controlled by the input 108. Switch 100 is closed when a positive voltage is received by square wave input 108 and open when a negative voltage is received by square wave input 108. Therefore, resistor 98 is selectively inserted and removed from the circuit depending on the square wave voltage. When the square wave input 108 is positive, the circuit illustrated in FIG. 3 will have a gain of minus resistor 94 divided by resistor 92. When the square wave input 108 is negative, switch 100 will be open and the gain of the circuit will be positive resistor 94 divided by resistor 92. Therefore, the circuit illustrated in FIG. 3 is a multiplying circuit.

With the circuit as illustrated in FIGS. 2-4, the output 34 will have the following value:

$$V_{out} = \tfrac{1}{2}Gi_{pp}(-R_{62})$$

where $$G = \left(\frac{R_{68}}{R_{66}}\right)(-\tfrac{1}{2})$$

and $$i_{pp} = 4Cf_0V_{pp}$$

wherein
$V_{out}$ = output 34 voltage,
G = total gain,
$R_{62}$ = Resistor 62,
$R_{66}$ = Resistor 66
$R_{68}$ = Resistor 68,
$i_{pp}$ = the induced current peak to peak,
$V_{pp}$ = the triangle wave voltage peak to peak
$f_0$ = the system frequency, and
C = the capacitance being measured, From the above, the capacitance as well as other properties of the capacitor, such as dielectric constant can be calculated. The dielectric constant is calculated as follows:

$$\text{DielectricConstant} = \left(\frac{tC_{ref}}{\epsilon_0 A}\right)\left(\frac{V_{cdut} - V_{back}}{V_{cref} - V_{back}}\right)$$

where:
$\epsilon_0$ = permittivity of vacuum t = sample capacitor thickness
A = sample capacitor area
$V_{back}$ = output voltage with no capacitor
$C_{ref}$ = value of reference capacitor
$V_{cref}$ = output voltage with $C_{ref}$ connected
$V_{cdut}$ = output voltage with sample capacitor connected From the above detailed description of the preferred embodiment and illustrated circuit, it should readily be appreciated that the above described invention can measure the capacitance of a capacitor applying a high bias voltage. The bias voltage applied is only limited by the breakdown voltage of the capacitor being tested. The surge to performing the measurement is isolated from the biasing voltage. As a result, very high biasing voltages can be applied to a capacitor without risk of damaging the measuring circuitry.

What is claimed is:

1. A circuit for measuring capacitance at any DC bias voltage comprising;
   a device under test to measure its capacitance having at least two opposite terminals;
   voltage supply means for applying a DC bias voltage to the device under test, said voltage supply means having a low AC impedance and being connected to one of the terminals of the device under test;
   switch means for switching between a device under test charging position and a device under test measuring position, said switch means being connected to the terminal of the device under test opposing the voltage supply means;
   device under test charging means coupled to the switch means at the device under test charging position;
   square wave generating means;
   triangle wave generating means, coupled in series with the square wave generating means, for applying a voltage waveform to the device under test from the measuring position of the switch means, the triangle wave being an integration of the square wave, wherein the generated triangle wave induces a current when the switch means is switched to the device under test measuring position;
   induced current sense means, coupled to said switch means at the device under test measuring position and coupled to an output of the triangle wave generating means, for detecting the induced current resulting from the application of the voltage waveform from the triangle wave generating means; and
   a quadrature demodulation circuit coupled to an output of the induced current sense means and the square wave generating means, wherein the quadrature demodulation circuit uses the square wave to generate a DC output voltage from the output of the induced current sense means, and wherein the DC output voltage is in a linear relation to the capacitance of the device under test.

2. A circuit for measuring the dielectric constant of a device under test at any DC bias voltage comprising;
   a device under test to measure its dielectric constant having at least two opposite terminals;
   voltage supply means for applying a DC bias voltage to the device under test, said voltage supply means having a low AC impedance and being connected to one of the terminals of the device under test;
   switch means for switching between a device under test charging position and a device under test measuring position, said switch means being connected to the terminal of the device under test opposing the voltage supply means;
   device under test charging means coupled to the switch means at the device under test charging position;
   square wave generating means;
   triangle wave generating means, coupled in series with the square wave generating means, for applying a voltage waveform to the device under test from the measuring position of the switch means, the triangle wave being an integration of the square wave, wherein the generated triangle wave induces a current when the switch means is switched to the device under test measuring position;
   induced current sense means, coupled to said switch means at the device under test measuring position and coupled to an output of the triangle wave generating means, for detecting the induced current resulting from the application of the voltage waveform from the triangle wave generating means; and
   a quadrature demodulation circuit coupled to an output of the induced current sense means and the square wave generating means, wherein the quadrature demodulation circuit uses the square wave to generate a DC output voltage from the output of the induced current sense means, and wherein the DC output voltage is in a linear relation to the dielectric constant of the device under test.

* * * * *